United States Patent [19]

Guarino

[11] 4,280,054
[45] Jul. 21, 1981

[54] X-Y WORK TABLE

[75] Inventor: Nicholas Guarino, Arlington, Mass.

[73] Assignee: Varian Associates, Inc., Palo Alto, Calif.

[21] Appl. No.: 34,505

[22] Filed: Apr. 30, 1979

[51] Int. Cl.³ .............................................. H01J 37/26
[52] U.S. Cl. ..................................... 250/440; 250/442
[58] Field of Search ................. 250/398, 492 A, 440, 250/442, 491, 311; 356/358

[56] References Cited

U.S. PATENT DOCUMENTS

| | | | |
|---|---|---|---|
| 3,307,035 | 2/1967 | Grasenick et al. | 250/440 |
| 3,597,091 | 8/1971 | Bowker | 356/358 |
| 3,738,754 | 6/1973 | Marcy et al. | 356/358 |
| 4,063,103 | 12/1977 | Sumi | 250/442 |

OTHER PUBLICATIONS

"Digitally Positioned Mechanical Stage", *J. Vacuum Sci. & Tech.*, Pasiecznick et al., vol. 15, May 1978, pp. 909–912.

*Primary Examiner*—Bruce C. Anderson
*Attorney, Agent, or Firm*—Stanley Z. Cole; Norman E. Reitz

[57] ABSTRACT

Apparatus comprising a work table movable along orthogonal axes, and optical means, including orthogonal mirrors movable with the table, for sensing the positions of the table along the axes, featuring an improvement wherein the table comprises a solid block of metal, means are provided to secure a workpiece to move with the block, and two orthogonal external surfaces of the block are polished to provide the mirrors.

3 Claims, 5 Drawing Figures

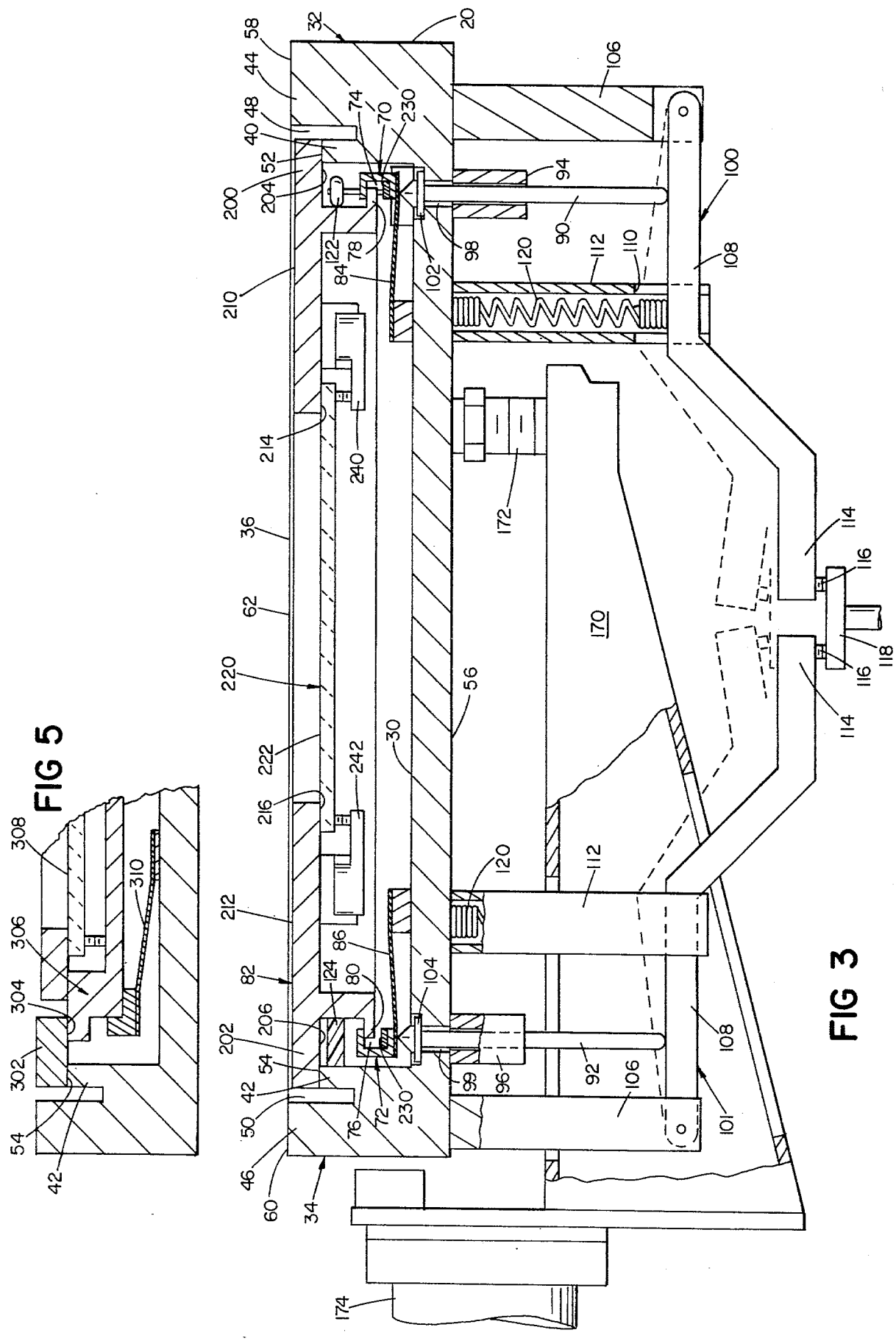

X-Y WORK TABLE

BACKGROUND OF THE INVENTION

In conventional electron beam lithography systems orthogonal mirrors are mounted on the work table to permit electro-optical control (e.g., with an interferometer) of table position along the x and y axes. For accurate control, the mirrors must be precisely mounted to begin with, and must remain orthogonal during operation, as workpieces are clamped and unclamped and so on.

SUMMARY OF THE INVENTION

In general, the invention features forming a work table from a solid block of metal, providing means to secure a workpiece to move with the block, and polishing two orthogonal external surfaces of the block to provide the mirrors.

In preferred embodiments the block has coplanar workpiece support surfaces orthogonal to the mirrors, and spring-biased rails are provided to receive workpiece (in the embodiment disclosed, a cassette) flanges and clamp coplanar workpiece surfaces against the support surfaces; the block is relieved between a mirror and an adjacent workpiece support surface to isolate the mirror from clamping forces; the block is of a beryllium alloy; and the block has a Faraday cup support surface for mounting a removable, precalibrated Faraday cup with its sensing grid in the plane of the workpiece support surfaces.

DESCRIPTION OF PREFERRED EMBODIMENTS

We turn now to the structure and operation of the preferred embodiments, first briefly describing the drawings thereof.

DRAWINGS

FIG. 3 is an enlarged sectional view taken along 3—3 of FIG. 2 with a cassette added.

FIG. 5 is a fragmentary view, similar to a portion of FIG. 3, on another embodiment.

STRUCTURE

Figure 1:
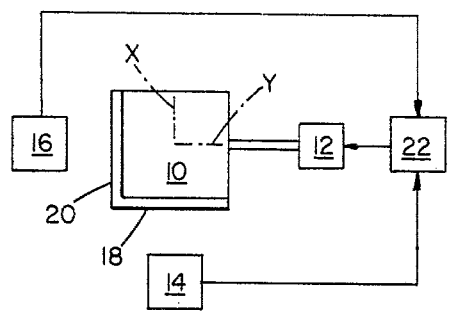
FIG. 1 is a block diagram of an x-y work table system embodying the invention.

Referring to FIG. 1, work table 10 is moved and positioned along x and y axes by an x-y drive 12. Interferometer detectors 14 and 16 cooperate with orthogonal mirrored surfaces 18 and 20 of table 10 to sense the positions of the table along these axes, and to send position signals to x-y drive control 22.

Figure 2:
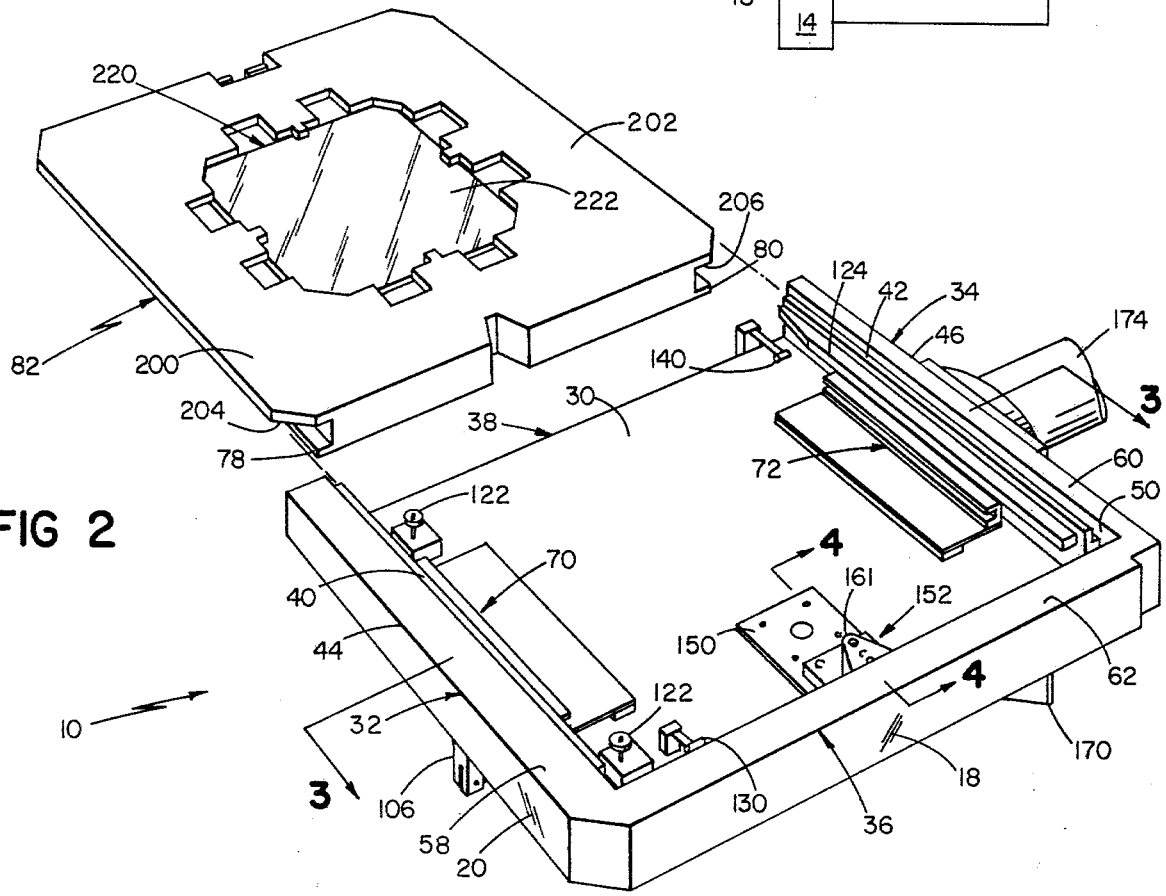
FIG. 2 is an isometric view of the x-y work table and a cassette.
Figure 4:
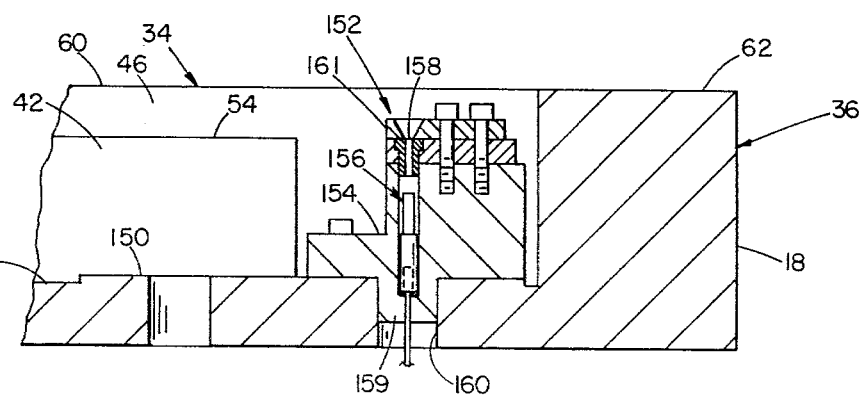
FIG. 4 is an enlarged sectional view taken along 4—4 of FIG. 2.

Table 10 is fabricated from a solid block of beryllium alloy (HP-20, supplied by Berylco) to provide a planar floor 30 (FIGS. 2–4) bounded on three sides by thick walls 32, 34, and 36. The fourth side 38 of the table is open. Outer wall surfaces 18 and 20 are coated with electroless nickel and polished to provide mirrors orthogonal (to within ½ arc-second with flatness of ⅛λ) to each other.

Walls 32 and 34 are machined to provide shortened inner portions 40 and 42 separated from outer portions 44 and 46 by vertical grooves 48 and 50. Portions 40 and 42 are machined and lapped to provide coplanar workpiece support surfaces 52 and 54 parallel to each other, to table bottom surface 56, and coplanar top surfaces 58, 60, and 62, all of which are orthogonal to mirror surfaces 18 and 20.

Just inward of each wall portion 40 and 42 is a Delrin clamping rail 70, 72. Each rail has an inwardly facing groove 74, 76 to receive a flange 78, 80 of workpiece cassette 82. Each rail is supported and biased toward floor 30 by a floor-mounted leaf spring 84, 86. Plungers 90, 92 are mounted beneath rails 70, 72 for vertical movement in bushings 94, 96 and through holes 98, 99 in the bottom of table 10 for forcing the rails away from floor 30. Collars 102, 104 prevent the plungers from dropping through holes 98, 99. Clamp linkages 100, 101 are arranged to actuate the plungers. Each such linkage has a fixed arm 106 to which is pivoted a movable arm 108. Arm 108 passes through a slot 110 in post 112 and terminates in a cantilevered end 114 with an adjustable screw 116 resting on drive plunger 118. Spring 120 in post 112 biases arm 108 downwardly. The ends of arms 108 have screws 116 which can be adjusted to touch plunger 118. Plungers 90, 92 rest on their respective arms 108.

Horizontally inwardly spring-biased cassette guide rollers 122 are mounted on floor 30 near the ends of wall 32, beyond the ends of, and above the level of, rail 70. Delrin guide rail 124 is mounted opposite rollers 122 just inside wall 34 above rail 72.

Microswitch 130 is mounted in the work table bottom just inwardly of wall 36. A second microswitch 140 is mounted at one side of open table end 38.

Floor 30 is machined to provide slightly raised platform 150 (FIGS. 2, 4) on which is mounted removable Faraday cup assembly 152. Assembly 152 has a block 154 spaced from table wall 36, and, supported in block 154, a conventional Faraday cup 156 having a sensing grid 158. An extension 159 of block 154 interlocks in recess 160 of the table. Platform 150 is machined to be parallel to surfaces 52, 54, and so forth, and so that, when block 154 is in place, grid 158 will be precisely coplanar with cassette support surfaces 52 and 54. The rounded nose 161 of assembly 153 provides an abutment for cassette 82.

Table 10 is mounted on generally box-like bracket 170 (FIG. 3) by three screws 172, which can be adjusted to level the table. Bracket 170 is rigidly cantilevered from x-y drive 12 by rod 174.

Cassette 82 (FIG. 3) has, in addition to lower flanges 78 and 80 described above, longer upper flanges 200, 202, which have coplanar lapped undersurfaces 204, 206 resting on support surfaces 52, 54 of the table when the cassette is clamped in place. The cassette also has inwardly extending flanges 210, 212 with lapped undersurfaces 214, 216 coplanar with surfaces 204, 206. Rectangular work element 220 (e.g., a semiconductor wafer or mask) is held in the cassette with its upper surface 222 to be "written" on clamped against flange surfaces 214, 216 by four manually operated, upwardly spring-biased right angle clamps, two of which are shown at 240, 242. Suitable stops (not shown) locate element 220 in the cassette.

OPERATION

To prepare table 10 for receipt of a cassette, plunger 118 is raised (by means not shown) to force arms 108 against plungers 90, 92, to raise rails 70, 72 slightly.

Cassette 82 is then inserted into the open side 38 of the table so that guide rollers 122 and guide rail 124 fit between the upper flanges 200, 202 and lower flanges 78, 80 of the cassette, and so that lower flanges 78, 80 then slip into (and ride on the floors 230 of) grooves 74, 76 of rails 70, 72. The system is calibrated so that, as cassette 82 so enters the table, cassette flange surfaces 204, 206 will ride about 0.010″ above support surfaces 52, 54 of the table. Microswitch 140 signals entry of the cassette, and microswitch 130 signals arrival of the cassette against nose 161. Plunger 118 is then retracted to allow leaf springs 84, 86 to force cassette flange surfaces 204, 206 against support surfaces 52, 54. In this condition, work element surface 222 will be precisely coplanar with support surfaces 52, 54 and Faraday grid 158, and thus orthogonal to mirror surfaces 18, 20.

Grooves 48, 50 (and the thickness of walls 32, 34, and 36) isolate mirrors 18, 20 from the forces of clamping and unclamping the cassette, preserving orthogonality. The separation of Faraday cup block 154 from wall 36 similarly isolates forces due to the abutment of the cassette against nose 160.

Because the table, with its integral mirrored surfaces, is of a single piece of metal, changes in mirror geometry due to thermal expansion and contraction are minimized.

The use of beryllium for the table gives an advantageously high strength to weight ratio.

Pre-alignment of the Faraday cup, and the use of a removable cup assembly, allow easy and fast replacement of the cup.

Other embodiments are within the following claims. E.g., as is shown in FIG. 5, the work table can be modified to clamp the cassette upwardly. To that end, precision reference rails 302 are screwed to wall portions 40 and 42. The undersurfaces 304 of rails 302 provide extensions of workpiece support surfaces 52 and 54. Cassette 306, carrying element 308, is clamped upwardly against surfaces 304 by leaf springs 310. Suitable linkages (not shown) are arranged to move springs 310 downwardly to allow insertion of the cassette. Wider work elements can be accomodated by the general arrangement of FIG. 5 by modifying the cassette so that the work element itself extends under and is clamped against surfaces 304.

What is claimed is:

1. A precision interferometer system including a work table for supporting a workpiece, said work table being moveable along orthogonal axes, a pair of orthogonal mirrors attached to and moveable with said table and intersecting respective ones of said orthogonal axes, optical sensing means mounted along each of said orthogonal axes to reflect a beam from said mirrors and thereby sense the displacement of said system along each axis, the improvement comprising said work table comprises a solid block of metal having two orthogonal external surfaces of said block polished to constitute said mirrors, said block also having an interior Faraday cup support surface;

a precalibrated Faraday cup assembly mounted on said interior Faraday cup support surface of said block so that the sensing grid of said Faraday cup has a fixed relationship to the surface of a workpiece supported on said work table; and means for securing said workpiece to move with said block.

2. A precision interferometer system in accordance with claim 1 wherein said precalibrated Faraday cup has its grid precisely coplanar with said surface of said workpiece.

3. A precision interferometer system in accordance with claim 2 wherein said precalibrated Faraday cup assembly includes a nose for helping to position said workpiece on said work table and wherein said assembly is spaced apart from the portions of said block constituting said mirror to isolate said mirror from forces exerted on said nose.

* * * * *